(12) United States Patent
Cooke

(10) Patent No.: US 7,369,422 B2
(45) Date of Patent: May 6, 2008

(54) SERIAL CONTENT ADDRESSABLE MEMORY

(76) Inventor: Laurence Hager Cooke, 25399 Spanish Ranch Rd., Los Gatos, CA (US) 95033

( * ) Notice: Subject to any disclaimer, the term of this patent is extended or adjusted under 35 U.S.C. 154(b) by 117 days.

(21) Appl. No.: 11/361,947

(22) Filed: Feb. 23, 2006

(65) Prior Publication Data

US 2007/0195570 A1    Aug. 23, 2007

(51) Int. Cl.
*G11C 15/00* (2006.01)
(52) U.S. Cl. .......................................... 365/49; 365/154
(58) Field of Classification Search ............... 365/154, 365/230.05, 194, 49
See application file for complete search history.

(56) References Cited

U.S. PATENT DOCUMENTS

| 5,305,258 | A | * | 4/1994 | Koshizuka ............. 365/189.01 |
| 5,808,929 | A | * | 9/1998 | Sheikholeslami et al. ..... 365/49 |
| 6,006,306 | A | * | 12/1999 | Haywood et al. ........... 711/108 |
| 6,389,579 | B1 | | 5/2002 | Phillips et al. |
| 6,999,331 | B2 | | 2/2006 | Huang |
| 2005/0135134 | A1 | | 6/2005 | Yen et al. |

* cited by examiner

*Primary Examiner*—Vu A. Le

(57) ABSTRACT

A technique is presented for implementing a content addressable memory (CAM) function using traditional memory, where the input data is serially loaded into a serial CAM. Various additions, which allow for predicting the result of a serial CAM access coincident with the completion of serially inputting the data are also presented.

7 Claims, 12 Drawing Sheets

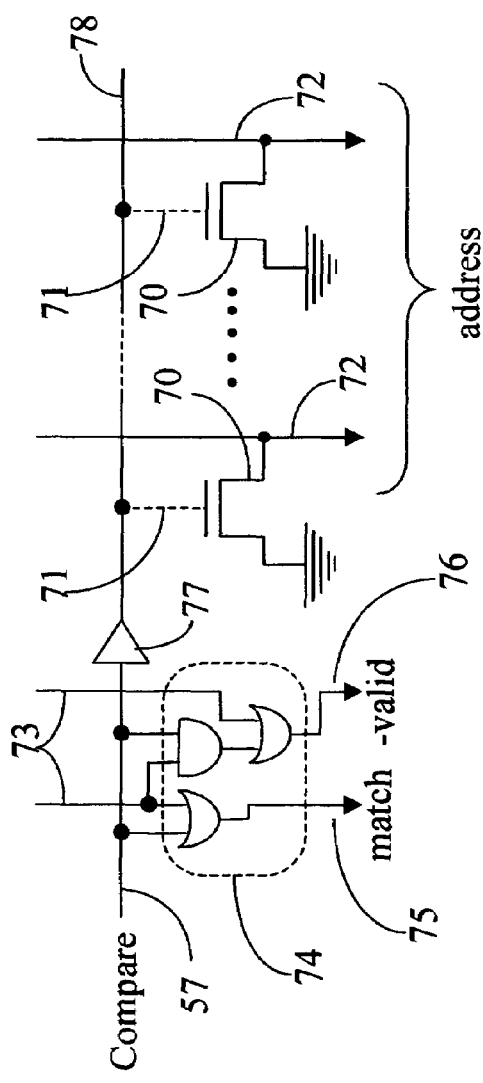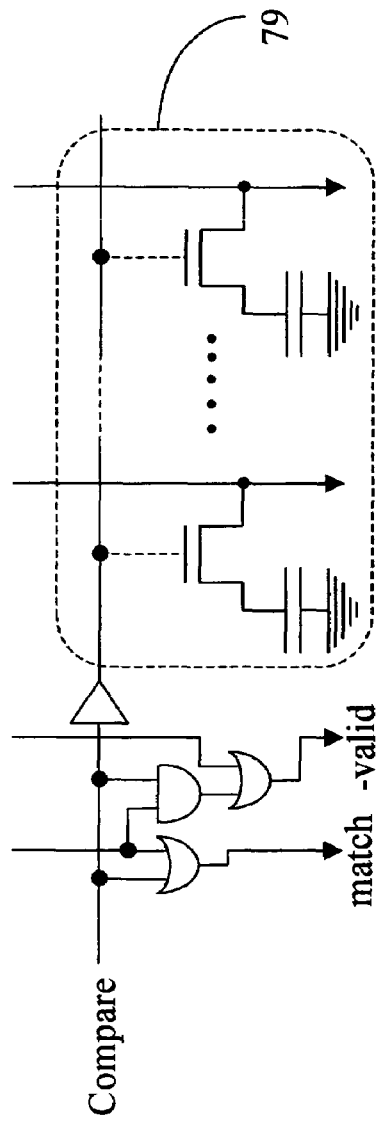
Figure 7a
Figure 7b

SERIAL CONTENT ADDRESSABLE MEMORY

FIELD OF THE INVENTION

The present invention pertains to serially addressing a traditional high density semiconductor memory core in a pipe-lined fashion to obtain the equivalent function of a content addressable memory with less logic.

BACKGROUND OF THE INVENTION

Numerous examples of content addressable memories (CAMs) exist including U.S. Pat. No. 6,999,331, granted Feb. 14, 2006 to Huang; U.S. Pat. No. 6,389,579, granted May 14, 2002 to Phillips et al.; and U.S patent application Ser. No. 10/609,756, filed Jun. 20, 2003, by Yen et al. They all refer to a bit of memory as taking from 8 to 16 transistors depending if the content addressable memory is binary, as shown in FIG. 1a, or ternary, as shown in FIG. 1b, and while the demand for fast content addressable memory has grown with the need for address translation in digital communications, the size of the memory has limited the product offerings to under a megabit per chip, while DRAM is approaching a gigabit per chip. At the same time, communications has become increasingly serial. The primary communications input to routers and switches is high-speed serial digital streams of data, much of which is self-clocked. Traditionally the address portion of a packet of data is serially read into a chip by a SERDES, and loaded into a register. Thereafter the register's contents are transferred to the data inputs of the CAM, to get the port address for the transfer of subsequent data stream in the packet.

The latency of the switching operation is critical to the smooth operation of switches and routers, but as can be seen, the content addressable memory operation doesn't begin until after the entire address has been captured. This latency also increases as the number of chips to hold the content addressable data grows because the hits between multiple chips must be resolved before the port address can be determined. Therefore, the ability to economically hold greater amounts of content addressable data would also reduce the latency.

Dynamic random access memory (DRAM) structures are the densest volatile digital memory structures in semiconductor technology. Each bit requires only one transistor and a capacitor, as can be seen in FIG. 2a. Unfortunately, these memories are often quite slow. Alternatively there exists static random access memory (SRAM) structures that require 3 to 6 transistors per bit, as can be seen in FIG. 2b, but are much faster, and require less sense circuitry. Traditionally, both of these types of memories are organized with more word lines than bit fines, since all the bits in a word are accessed at the same time.

SUMMARY OF THE INVENTION

This disclosure describes a way to serially access all the data within a high-density DRAM or SRAM digital memory in a pipelined fashion, for the purposes of translating the inputted data, based on its content, into an associated value. To accomplish this, the memory core is organized with more bit lines than word lines, and the data in the memory is transposed relative to a normal memory, such that each word line addresses one bit of all the words in the memory, hence we will refer to it as a bit line. Similarly, in a traditional memory the accessed word of data is outputted on the bit lines, but since the data is transposed in our memory, we will refer to these bit lines as data lines.

Using the new nomenclature, N bits of input data is entered into the serial CAM in a serial fashion, one bit at a time. The CAM consists of M words of memory and M sets of comparison logic, one for each word of memory. As each input data bit enters the CAM, the corresponding bit in each word is accessed and available on that word's data line. The input data bit is then simultaneously compared with its corresponding data bit from all the words in the memory. The results of these comparisons are stored such that at the end of N clock cycles only those words that match all the input data bits entered are still set. The resulting M bits are then encoded and optionally translated into a port address, if one exists.

In this fashion, the CAM operation still takes only one memory access after all address bits are available, but the memory may be DRAM or SRAM, which is much denser than a traditional CAM and therefore more cost efficient.

The present disclosure presents both a Binary serial CAM and a mixed Binary/Ternary CAM logic, both of which work using the above technique.

In addition, since the addressing sequence is the same for every CAM operation, pre-fetch of the data is possible, which can, in some cases, with the appropriate look-ahead logic, completely eliminate the delay from the acquisition of the last bit of input data to the output of an appropriate translated address

BRIEF DESCRIPTION OF THE DRAWINGS

The invention will now be described in connection with the attached drawings, in which:

FIGS. 7a and 7b are diagrams of encode logic.

DESCRIPTION OF VARIOUS EMBODIMENTS

The present invention is now described with reference to FIGS. 1-12, it being appreciated that the figures illustrate the subjects matter and may not be to scale or to measure.

Figure 1B:
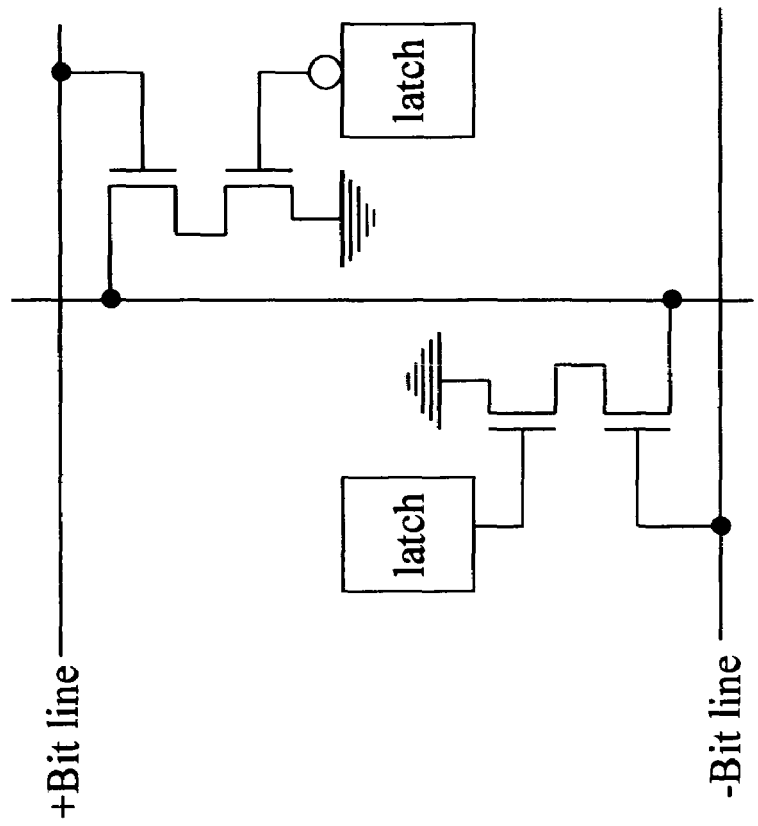
FIGS. 1a and 1b are diagrams of binary and ternary CAM bits.
Figure 1A:
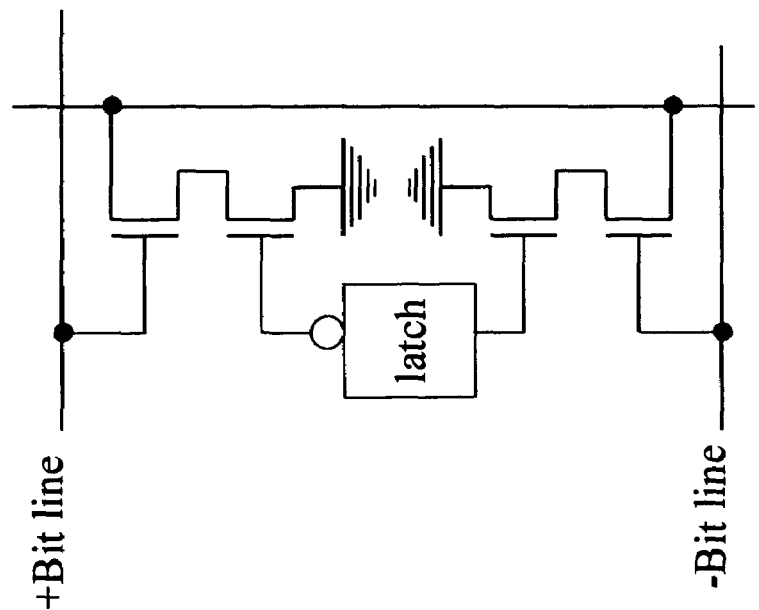
Figure 2B:
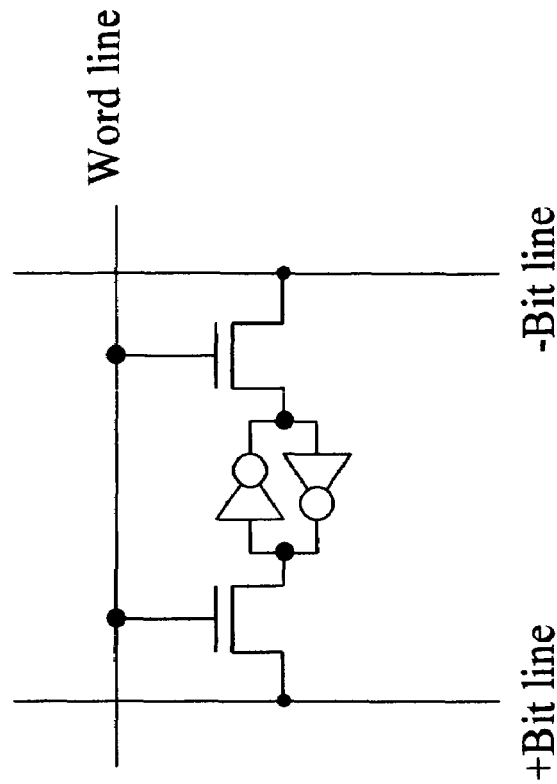
FIGS. 2a and 2b are diagrams of a DRAM bit and an SRAM bit.
Figure 2A:
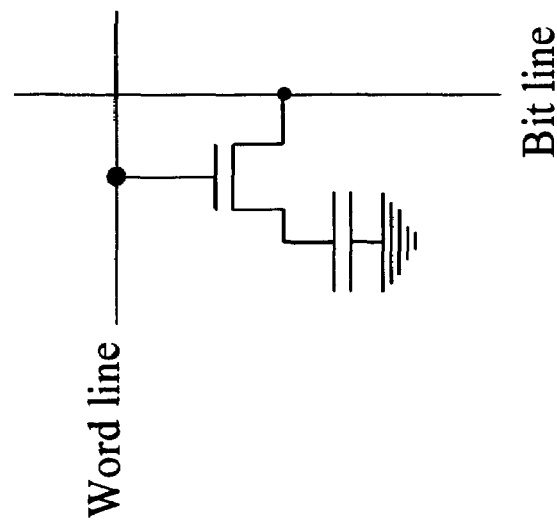
Figure 3:
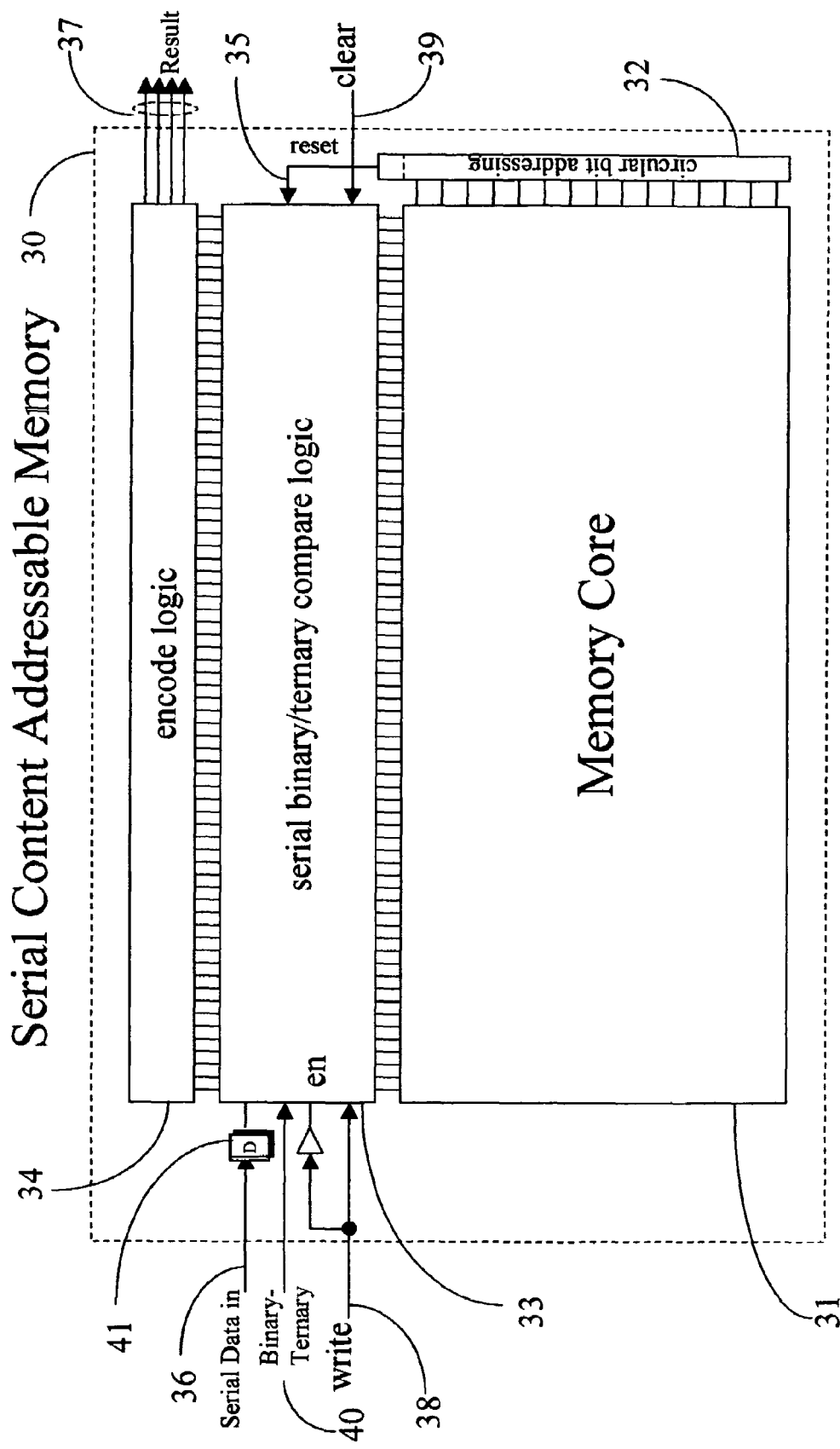
FIG. 3 is a diagram of an embodiment of a serial CAM.

A preferred embodiment of the present invention is a serial content addressable memory 30, consisting of a memory core 31, circular bit addressing logic 32 serial compare logic 33 and encode logic 34 as shown in FIG. 3. It is further contemplated that the memory core may be composed of either DRAM or SRAM cells. Each bit in the memory core 30 is successively addressed by clocking the circular bit addressing logic 32, which consists of a circular shift register comprised of N+1 bits with only one bit set. Each of N bits drives one of the bit lines to the memory core 31. The N+1 bit drives a reset signal 35, which clears the comparison bits to begin a new operation. To perform a content addressable memory operation, the input data is placed, one bit at a time, on the serial data in line 36, clocked into a single bit latch or flip-flop 41 when the content addressable memory is clocked. On the N+1 clock, after the N bits of input data have been entered, the results from the encode logic 34 are available on the result lines 37. To add data into the memory core, the write line 38 is set high, and N bits of input data are written into the next available word of memory, on successive clock cycles. One or more, words of memory may be cleared by inputting an exact match of the word or words to be cleared and setting the clear line 38 high, which clears all the words that match the inputted data.

Figure 4:
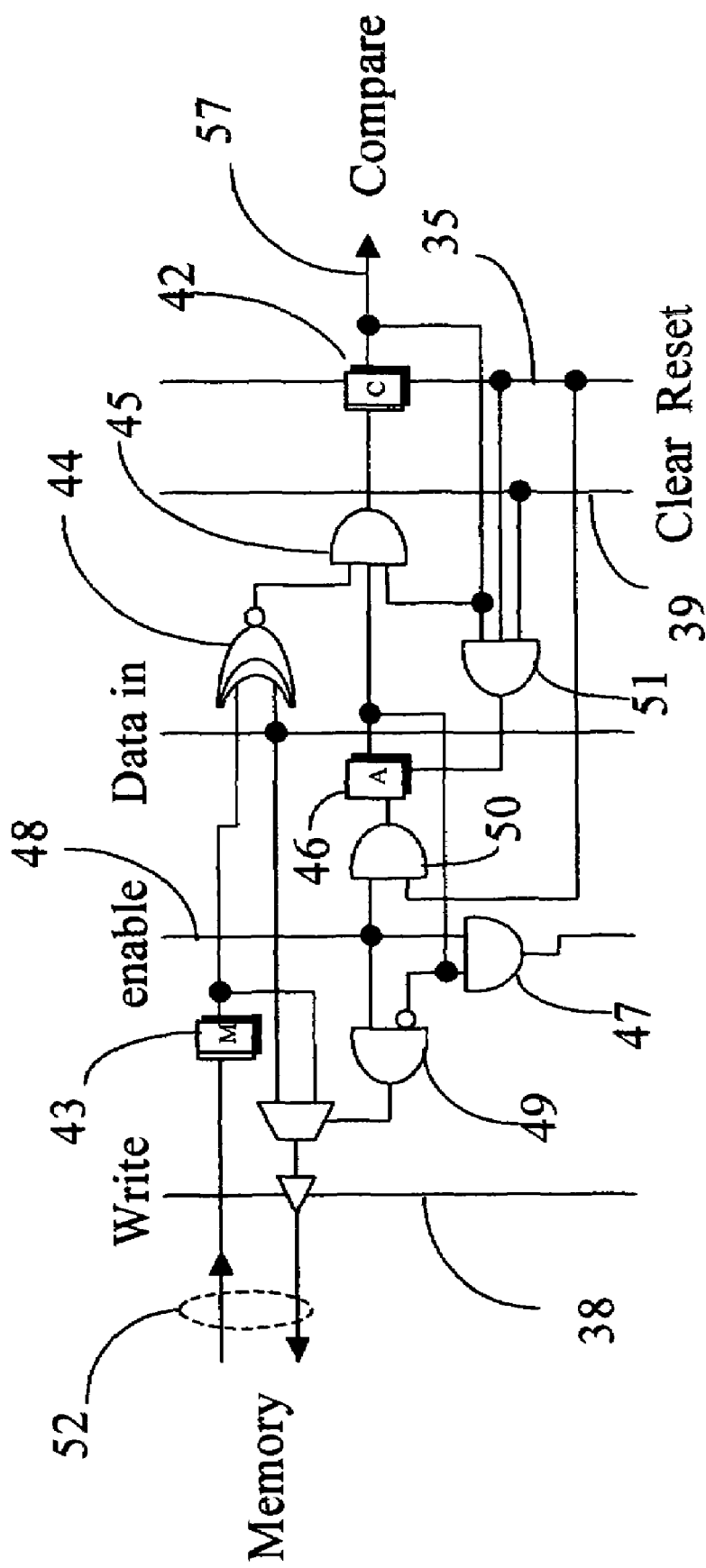
FIG. 4 is a diagram of one embodiment of the logic in each word of the serial CAM.

Reference is now made to FIG. 4, one embodiment of the compare logic associated with a single word of memory. Prior to loading the address, each compare latch or flip-flop 42 for all the words in memory is synchronously set to logic level 1 by the reset signal 35. At the beginning of the compare operation, when the memory is clocked, the first bit of data from the word in memory is captured in a latch or flip-flop 42. On the next clock cycle this data is compared with the data in value by an XNOR gate 44, and the results are gated by the state of the compare flip-flop 42 and the address flip-flop or latch 46, which is 1 if this word has contents to compare. On this and each successive clock cycle, the compare flip-flop 42 continues to capture a logic 1 level as long as the word has contents (the address flip-flop is set to a logic level 1) and the output of the data in flip-flop 42 is the same as the bit from the memory flip-flop 43. After comparing all N bits of the serial data in 36 with all the bits in the memory core 31 the compare flip-flops 42 that still have a logic level 1, signify a match.

When writing a new word into memory, the write signal 36 is set high, which drives the enable signal 48, for the first word high. The AND gate 47, gates the enable signal 48 low after passing the first unused word. The AND gate 49 selects the data from the memory flip-flop 43 for all other words except the first unused word, where the data from the data in flip-flop 41 is selected. The AND gate 50 ensures the address flip-flop 46 is set after writing the data into that word of memory, on the next cycle reset is set high.

Figure 5:
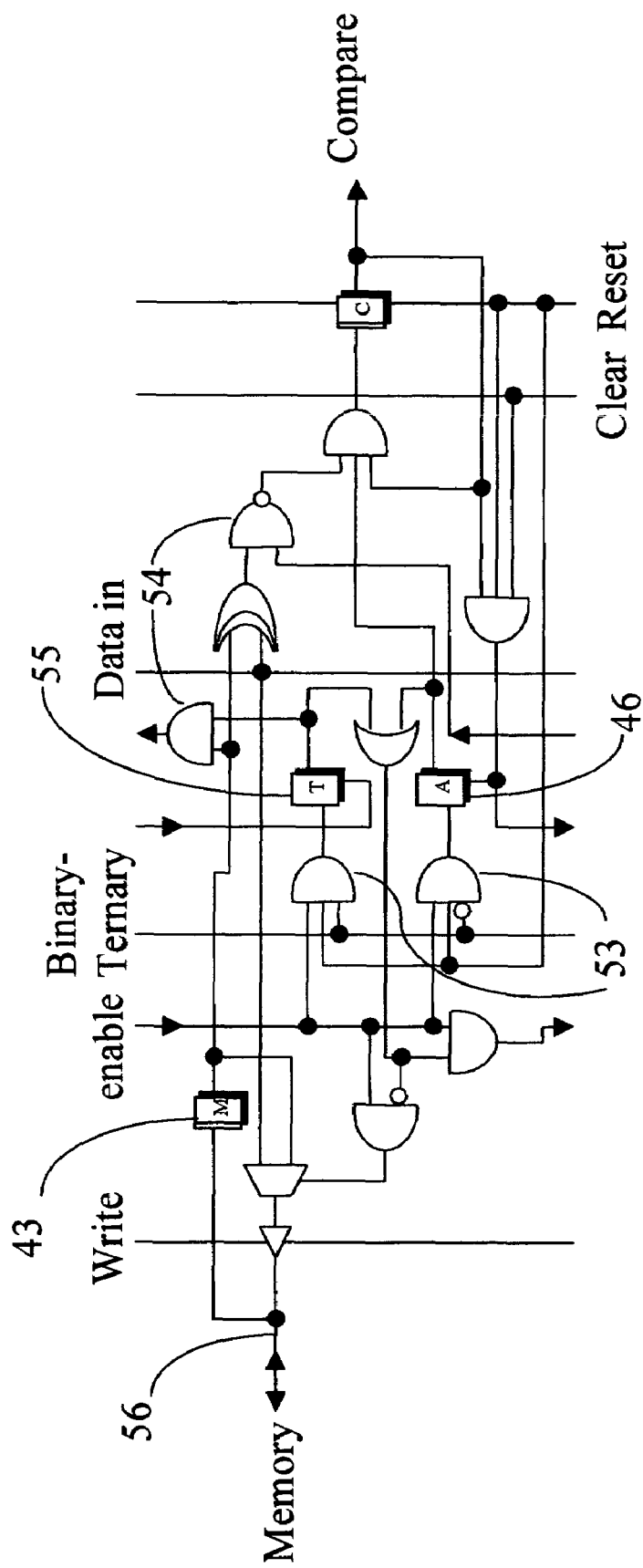
FIG. 5 is another embodiment of the logic in each word of the serial CAM.

To delete a word from memory, the clear signal 39 is set high on the same cycle reset is set high. The AND gate 51 clears the address flip-flop or latch 46 of the words whose compare signals 57 are still set high. The words that matched data inputted on the serial data in line 36, are cleared. It also should be noted that the memory may have separate lines for reading and writing 52 as shown here, or alternatively a single data line 56 for both reading and writing data to memory, as shown in FIG. 5.

As can be seen by in FIG. 4 and description above, this logic ensures loading, erasing and binary comparing of data within one clock cycle following the serial loading of input data.

Some CAMs have multiple bits per bit they compare. Three values are encoded in the two bits; zero, one and don't care. The "don't care" value always compares with the input data. This is traditionally called a Ternary CAM.

In another embodiment of the present invention, a variably mixed Binary/Ternary CAM is presented. Furthermore the number of binary entries in the memory and the number of ternary entries is solely a function of what is written into the memory, since any entry may be defined as binary and any pair of entries may be defined as ternary. In addition a binary entry may be converted into a ternary entry by adding its corresponding ternary data in the word following the binary entry.

Reference is now made to FIG. 5, another embodiment of the compare logic associated with a single word of memory. In this embodiment of the compare logic there exists two address flip-flops per word; one address flip-flop 46 identifies the existence of normal data, and one ternary flip-flop 55 identifies "don't care" ternary data. The logic 53 ensures only one of the two flip-flops 46 and 55 is set after writing a word of data into the memory. This is done during the reset cycle following a write operation by setting the Binary-Ternary signal 40 either high to signify normal data or low to signify ternary "don't care" data. In this embodiment a bit of "don't care" data is signified by a logic level 1 in a word whose ternary flip-flop 55 is set high. The ternary data is not compared with the values on the serial data in flip-flop 40, rather two additional gates 54 combine the values from the memory flip-flop 43 and the ternary flip-flop 55 and use it to select or ignore the bit compare of the previous word. In this way logic level 1s in a word of ternary data that follows a word of addressed data act as "don't care" bits when comparing the addressed data with the serial data in. When clearing words from memory, both the address flip-flop 46 of the compared word and the ternary flip-flop 55 of the next word are cleared. In this fashion any amount of binary or ternary data may be loaded into the memory 31, and varied as needed. Furthermore if the word following a word of binary data is unused or cleared, it may be loaded with ternary data, and subsequently all comparisons of the inputted data with the binary data from that word will use the following word as ternary "don't care" data in the comparison.

Figure 6B:
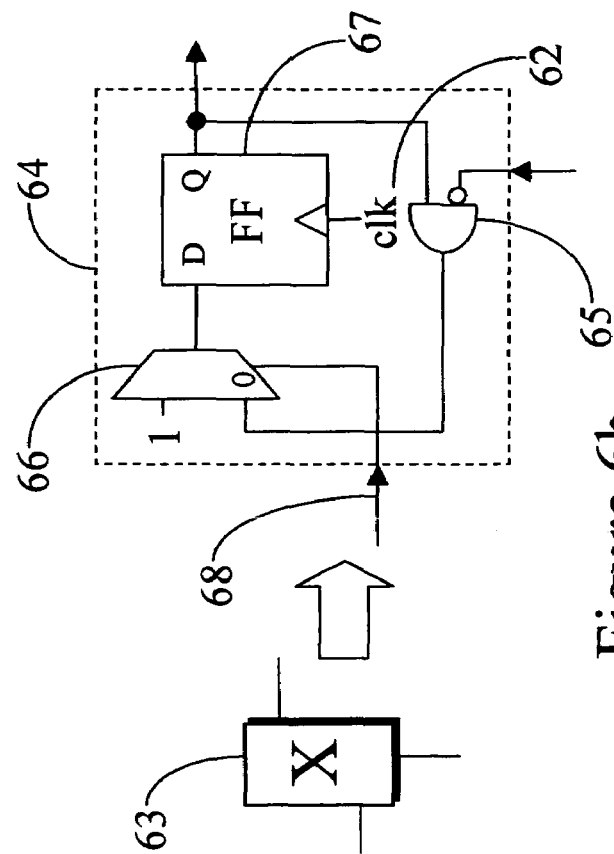
FIGS. 6a and 6b are diagrams of Flip-flops.
Figure 6A:
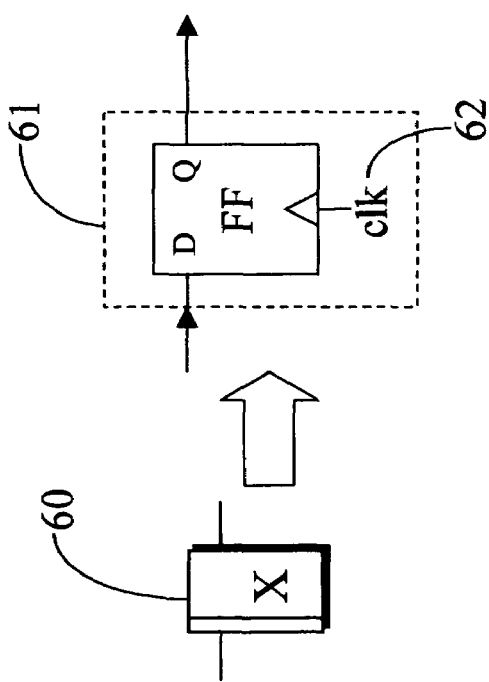

Reference is now made to FIG. 6a, a diagram of a Flip-flop. The symbol 60 is equivalent to the diagram 61. The clock 62 is implicit. This symbol is used for Flip-flops 42, 43 and 80 in FIGS. 3, 4, 5 and 8.

Reference is now made to FIG. 6b, another diagram of a Flip-flop. The symbol 63 is equivalent to the diagram 64, which includes a NAND gate 65 to synchronously clears the Flip-flop 67, a multiplexor 66, which either synchronously loads a 1 into the Flip-flop 67 when the select input 68 is 1 or re-circulates the data in the Flip-flop when the select input 68 is 0. This symbol is used for Flip-flops 46 and 55 in FIGS. 4, 5 and 8, and Flip-flops 121 and 123 in FIG. 12.

Reference is now made to FIG. 7a, a diagram of an embodiment of the encode logic for a single word. This version of compare logic consists of a multiplicity of transistors 70 whose gate inputs 71 are either tied to ground in such a way that each compare line 57 through an optional buffer 77 selects a unique combination of transistors. The data lines 72 are typically pre-charged to a high level such that when a compare occurs, the transistors connected to the buffered compare line 78 pull their data lines 72 low, to output the address of the matching word. The inputs 73 to the control logic 74 are tied to ground before the first word. The match line 75 is set high when one or more compare lines 57 are high, and the—valid line 76 is set high when two or more compare lines 57 are high. The data lines 72 and control lines 75 and 76 form the set of result lines 37 shown in FIG. 3.

It is further contemplated that different control logic may gate the compare line 57 at the buffer 77 to select just the first compare line that is high, and reset the compare flip-flops of selected words on successive cycles until—valid is low.

Reference is now made to FIG. 7b, another diagram of encode logic for a word of memory. Alternatively the compare line 57 may select a word of memory 79, which may also be loaded following the loading of the corresponding word of the memory core 31 in FIG. 3.

In another embodiment of the present invention, look ahead may be employed in the comparison process to occasionally finish the comparison prior to comparing the last serial data in bits with their corresponding bits of memory.

Figure 8:
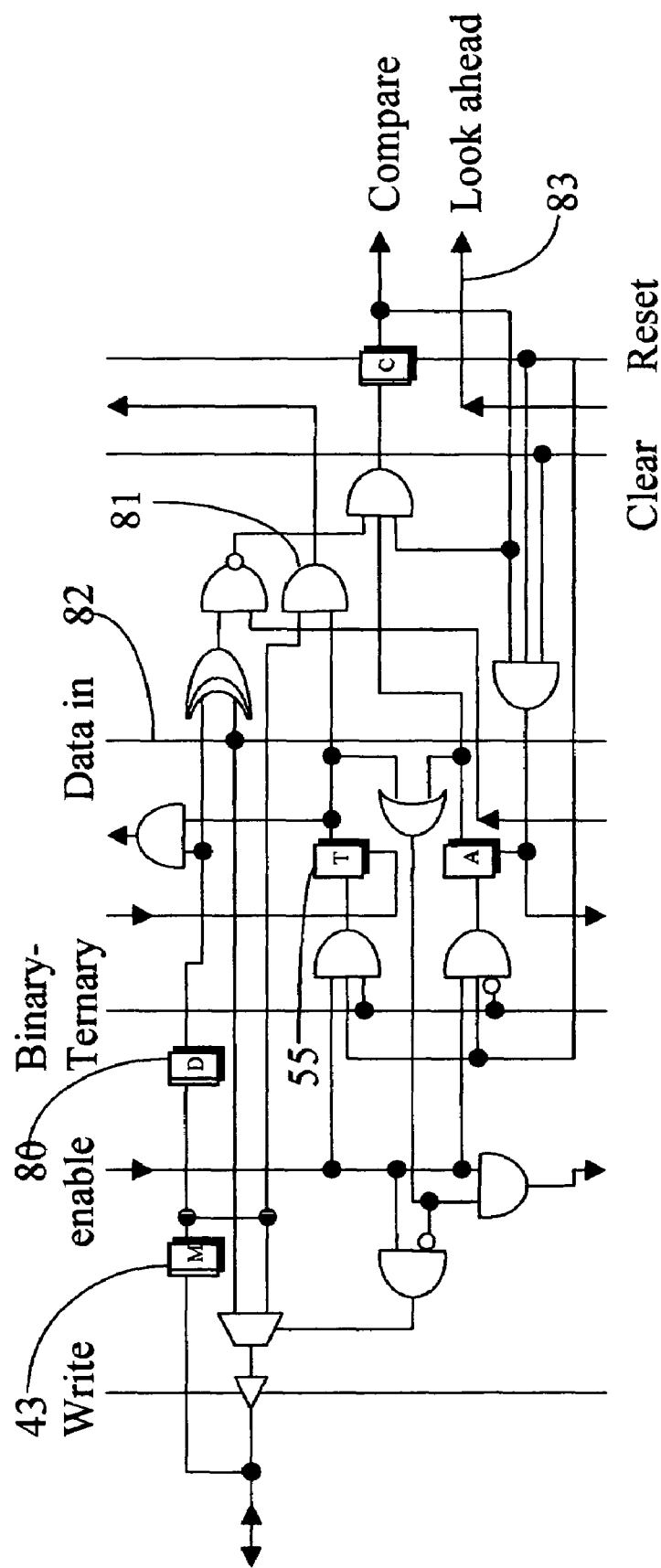
FIG. 8 is another embodiment of the logic in each word of the serial CAM.

Reference is made to FIG. 8, another embodiment of the compare logic for each word of the serial CAM. In this case there is an additional flip-flop stage 80, such that at least one clock cycle ahead of the first serial data in value, the first bit of every word of memory is loaded into the memory flip-flop 43. On the next clock, the first bit of serial data in is compared with the first bit of memory data that is transferred to the additional flip-flop 80. At the same time the next bit of data is available in the memory flip-flop 43. The value in the memory flip-flop 43 is gated 81 with the ternary flip-flop's value and set on the look-ahead line 83 for the previous word. The look-ahead line is only set when the next bit is a ternary "don't care".

Figure 9:
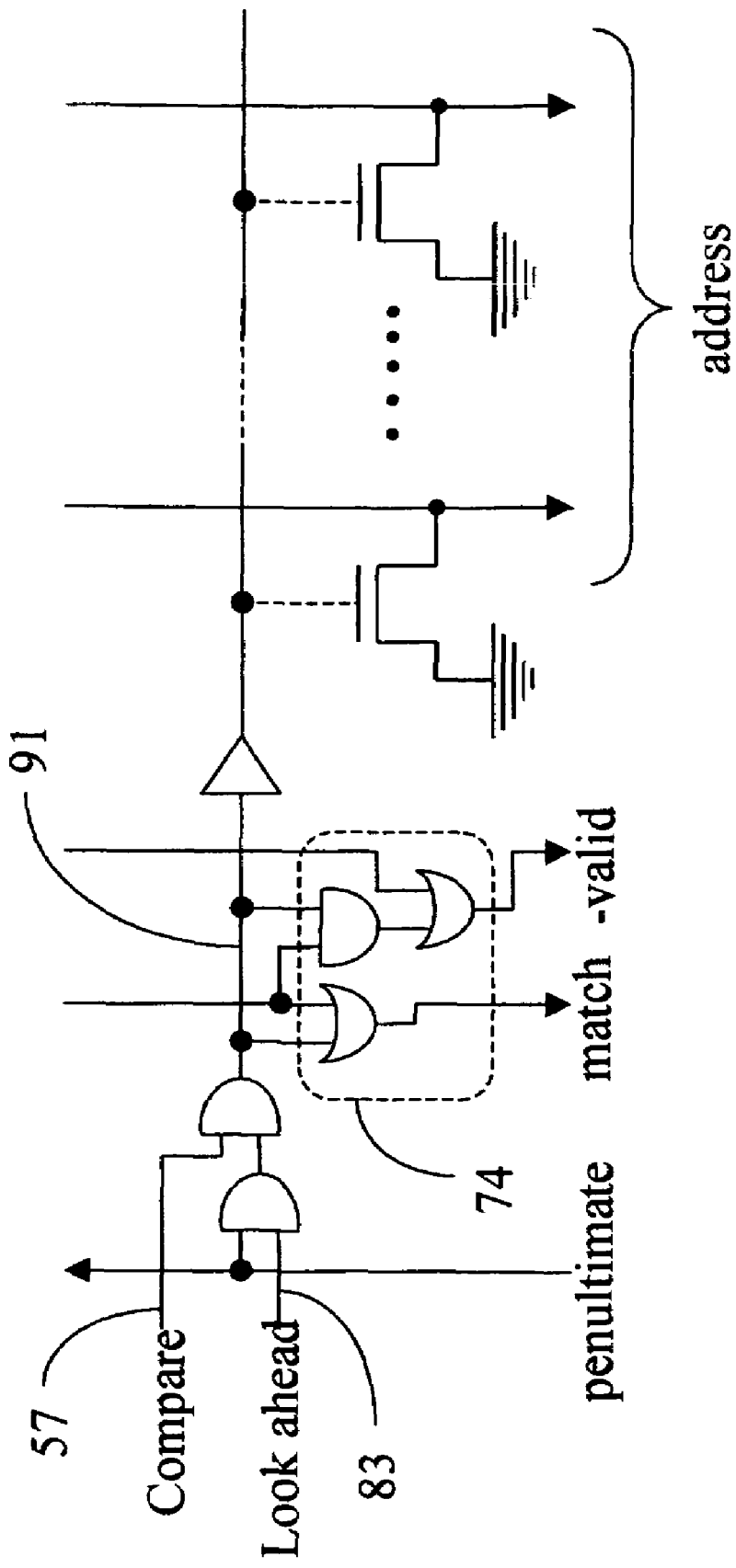
FIG. 9 is another diagram of encode logic with look-ahead.

Reference s now made to FIG. 9, another diagram of encode logic, but with look-ahead logic. In this example the look-ahead line 83 is gated with a global penultimate line 90 that is obtained from the circular bit addressing logic 32 in FIG. 3, in a manner similar to the reset line 35, in FIG. 3, and is further gated with the compare line 57. The resulting compare 91 drives the control logic 64. This has the effect of limiting the compares to those words that compare up to the last bit and will compare on the last bit because it is a "don't care". If a match occurs on this next to last cycle, the results may be captured on the same clock that is capturing the last serial data in bit into the flip-flop 40 in FIG. 3, which is equivalent to zero latency between the serial data in and the results out.

In yet another embodiment of the present invention, the memory core may have orthogonal read and write operations, which allows for parallel loading of the CAM data, while continuing with serial reading of the data. This is desirable since in most systems the data being loaded into the memory is obtained, generated and stored in parallel form, whereas most of the data being used in the CAM access, to obtain translated results, is transferred to the CAM serially.

Figure 10:
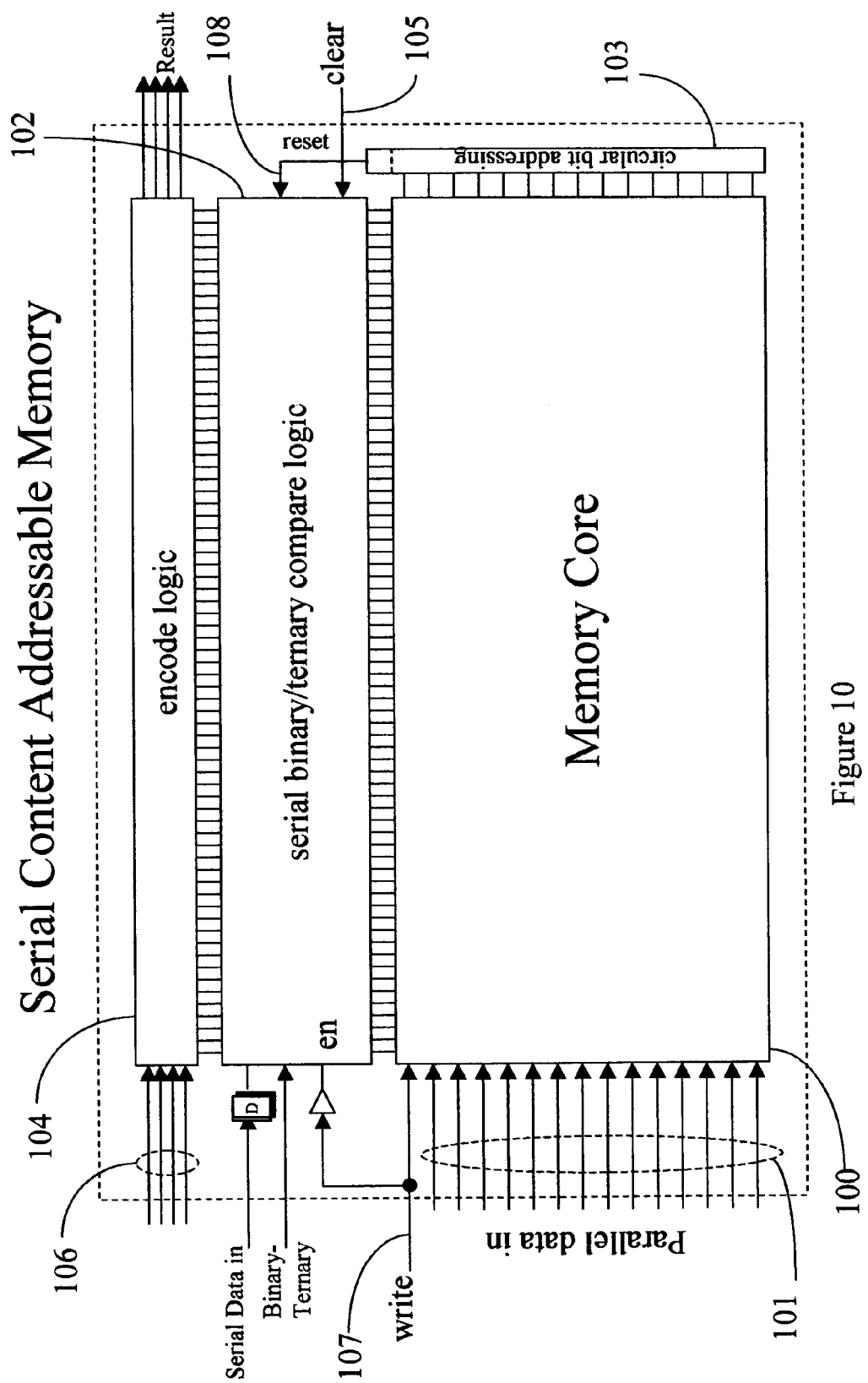
FIG. 10 is a diagram of a serial CAM with parallel write capability.

Reference is now made to FIG. 10, a diagram of a serial CAM with parallel write capability. In this embodiment, the memory core 100 includes a parallel data in port 101 for writing data into the memory. The address lines for writing the parallel data into the memory are perpendicular to the parallel data in lines and originate in the compare logic module 102. The bit address lines originate in the circular bit addressing logic 103, and select the bit to be read into the compare logic module 102 for each word.

Figure 11:
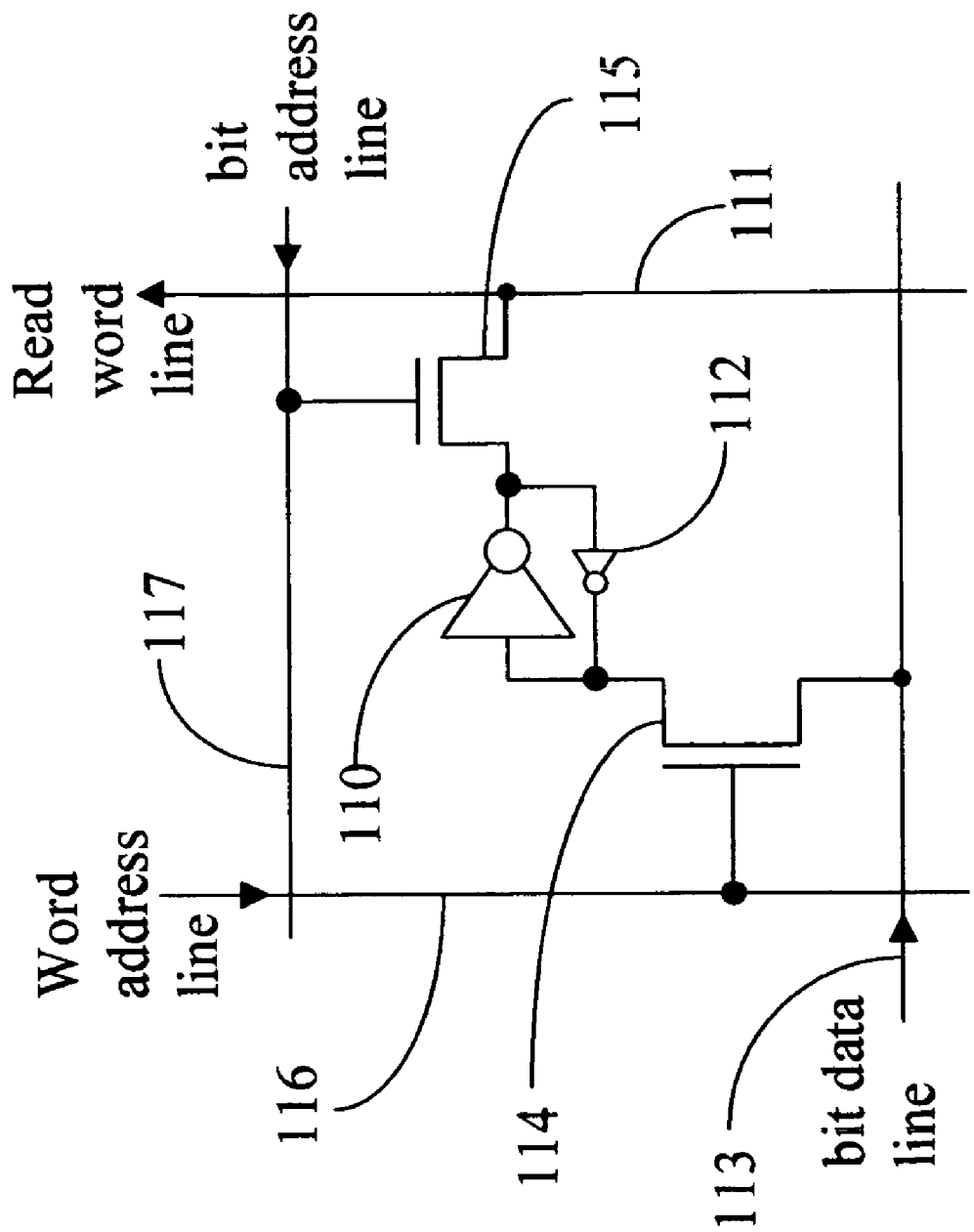
FIG. 11 is a diagram of an SRAM bit for a serial CAM with parallel write capability.

Reference is now made to FIG. 11, a diagram of an SRAM bit for a serial CAM with parallel write capability. It is relatively common in a two port SRAM to make the inverter 110, which drives the read word line 111 larger than the inverter 112, which must be over driven by the bit data line 113, but in this case since the word lines are relatively short compared to the number of words, the optimal ratio may be larger than a normal SRAM. Similarly, it is relatively common to have a larger N channel transistor 114 for writing than the N channel transistor 115 for reading, but in this case the optimal ratio will also have to be adjusted for the different configuration of the memory, since the capacitance of the word address line 116 is less important than the bit address line 117 capacitance in this configuration. What is unusual is the orthogonal nature of the read versus write.

Figure 12:
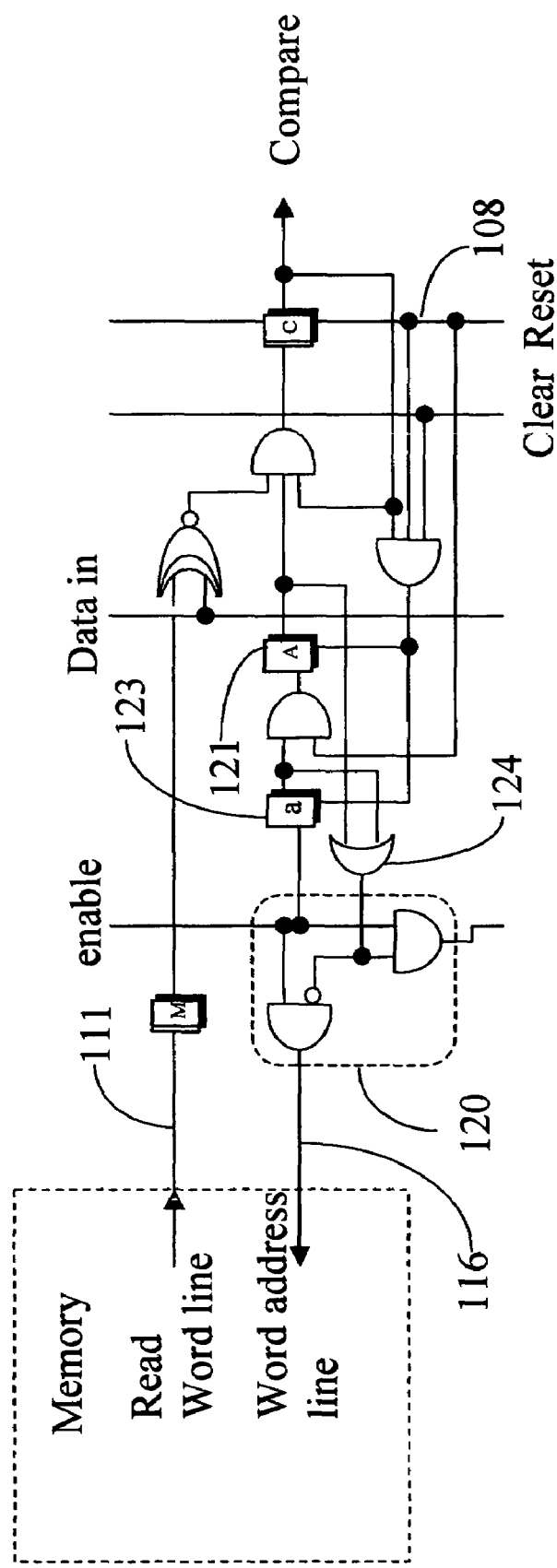
FIG. 12 is a diagram of compare logic for the serial CAM in FIG. 10.

Reference is now made to FIG. 12, a diagram of compare logic for the serial CAM in FIG. 10. Just as in the previous versions of the compare logic, the read word line 111 from the memory drives a memory flip-flop 124, but in this case the enable logic 120 drives the word address line 116 directly, selecting the first available word address to write into, regardless of whether a comparison is currently being done. The address flip-flop 121 is enabled only after the reset line 108 is set high, but during each write the alternate address flip-flop 123 is enabled to be loaded with a 1. Both the address flip-flop 121 and the alternate address flip-flop 123 control the next word's enable signal through an OR gate 124. As a result multiple writes can occur simultaneously with the serial read of the CAM, but the new data will only be activated at the beginning of the next CAM access.

It is contemplated that other parallel operations may be included in other versions of the serial CAM such as parallel write of the encode memory, if it exists, through data inputs 116 as shown in FIG. 10, or parallel operations to load binary and ternary data by combining the features of the compare logic in FIG. 8 with the features of the compare logic in FIG. 12. It is also contemplated that other look-ahead functions may be similarly generated, such as including a last bit value and presenting the results if the selected words in a memory such as shown in FIG. 7 contain the same value. It is further contemplated that standard forms of addressing, or serial addressing may be used to load and clear the memory cores 31 and any memory that exists in the encode 34 shown in FIG. 3, or in the memory 100 and encode 104 shown in FIG. 10. Furthermore it is contemplated that different combinations of logic, some of which employ fewer transistors, may be employed in producing the functions or functions similar to the functions described in the compare logic 33 and the encode logic 34 in FIG. 3, or in the compare logic 102 and the encode logic 104 in FIG. 10. Lastly it is contemplated that various forms of non-volatile memory such as ROM, and PROM may be used in place of the DRAM or SRAM in the memory core 31 and encode 34 in FIG. 3, or memory core 100 and encode 104 in FIG. 10.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. A content addressable memory comprising:
    a single data input,
    a standard memory;
    compare logic for each word of said standard memory, and
    encode logic;
wherein the input data is serially loaded into said content addressable memory through said single data input.

2. A content addressable memory as in claim 1 wherein said encode logic also includes a standard memory.

3. A content addressable memory as in claim 1 further comprising:
    multiple result outputs, wherein on at least one operation of said content addressable memory the results are available on said result outputs coincident with loading the last bit of said input data into said content addressable memory.

4. A content addressable memory comprising:
   a single data input,
   a standard memory;
   compare logic for each word of said standard memory, and
   encode logic;
wherein said standard memory is selectively loaded with varying amounts of binary and ternary data.

5. A content addressable memory as in claim 4, wherein said varying amounts of binary and ternary data may be changed by deleting old data and adding new data.

6. A content addressable memory as in claim 4, wherein at least one word of said varying amounts of binary data may be changed to ternary data by adding the a word with the "don't care" bits.

7. A content addressable memory comprising:
   a two port SRAM memory with a parallel data write port,
   a single data input,
   compare logic for each word of said SRAM memory, and
   encode logic;
wherein the comparison of serially loaded input data occurs with all preexisting data in said SRAM coincident with one or more writes of data on said parallel data write port into said SRAM, said writes of data into said SRAM become said pre-existing data following the completion of said comparison, and
   said two port SRAM comprising:
      a multiplicity of single bit SRAM cells with separate read and write ports,
      a multiplicity of bit data lines parallel to a multiplicity of bit address lines, and
      a multiplicity of word address lines parallel to a multiplicity of read word lines;
   wherein data on said bit data lines is written into a multiplicity of said SRAM cells by selecting one of said multiplicity of word address lines, data is read out of a multiplicity of said SRAM cells onto a multiplicity of said read word lines by selecting one of said multiplicity of said bit address lines, and all of said bit address lines are perpendicular to all of said word address lines.

* * * * *